(12) United States Patent
Morrison et al.

(10) Patent No.: US 7,611,578 B2
(45) Date of Patent: *Nov. 3, 2009

(54) PROCESSES OF FORMING SMALL DIAMETER RODS AND TUBES

(75) Inventors: Finlay Doogan Morrison, Cambridge (GB); James Floyd Scott, Cambridge (GB)

(73) Assignee: Cambridge Enterprise Ltd. (GB)

( * ) Notice: Subject to any disclaimer, the term of this patent is extended or adjusted under 35 U.S.C. 154(b) by 157 days.

This patent is subject to a terminal disclaimer.

(21) Appl. No.: 10/544,816

(22) PCT Filed: Feb. 5, 2004

(86) PCT No.: PCT/GB2004/000452

§ 371 (c)(1),
(2), (4) Date: Jun. 28, 2006

(87) PCT Pub. No.: WO2004/070443

PCT Pub. Date: Aug. 19, 2004

(65) Prior Publication Data

US 2006/0249070 A1    Nov. 9, 2006

(30) Foreign Application Priority Data

Feb. 5, 2003   (GB)  .................. 0302654.9

(51) Int. Cl.
*C30B 21/02*    (2006.01)

(52) U.S. Cl. .................. 117/68; 117/69; 117/71; 117/74

(58) Field of Classification Search ............ 117/69, 117/71, 74, 75, 79
See application file for complete search history.

(56) References Cited

U.S. PATENT DOCUMENTS 6,093,246 A     7/2000   Koops et al.

FOREIGN PATENT DOCUMENTS

DE        101 01 119       7/2002

OTHER PUBLICATIONS

Steinhart, M. et al. *Polymer Nanotubes by Wetting of Ordered Porous Templates*, Science, American Association for the Advancement of Science, U.S. vol. 296, Jun. 14, 2002 p. 1997.
J. Schilling, et al. *Three Dimensional Photonic Crystals Based on Macroporous Silicon with Modulated Pore Diameter*, Applied Physics Letters, American Institute of Physics, New York, vol. 78, No. 9, Feb. 26, 2001 pp. 1180-1182.
W. Hu, et al., *Growth of Well-Aligned Carbon Nanotube Arrays on Silicon Substrates Using Porous Alumina Film As a Nanotemplate*, Applied Physics Letters, American Institute of Physics, New York, vol. 79, No. 19, Nov. 5, 2001.
F.D. Morrison, et al., *High Aspect Ratio Piezoelectric Strontium-Bismuth-Tantalate Nanotubes*, Journal of Physics, Condensed matter. Aug. 27, 2003, pp. L527-L532.
Y. Luo et al., *Ferroelectric lead zirconate titanate and barium titanate nanotubes*, Integrated Ferroelectrics, 2003, Gordon & Breach, Netherlands, vol. 59, Mar. 9, 2003 pp. 1513-1520.
F.D. Morrison, et al., *Ferroelectric nanotubes*, Reviews on Advanced Materials Science, 2003, Advanced Study Center, Russia, vol. 4, No. 2, Aug. 2003.
International Search Report dated May 26, 2004.

*Primary Examiner*—Robert M Kunemund
(74) *Attorney, Agent, or Firm*—Fish & Richardson P.C.

(57) ABSTRACT

The invention provides a method for the production of a photonic device comprising providing a substrate, forming in the substrate substantially straight pores, lining or filling the pores with a material having voltage-dependent index of refraction, and removing part but not all of the substrate materials so that an array remains of tubes or rods of material having voltage-dependent index of refraction. In a variant of the method the deposited material is piezoelectric and the substrate is completely removed, resulting in piezoelectric tubes or rods of small diameter, generally below 10 μm.

21 Claims, 6 Drawing Sheets

Fig. 4. Top of SBT tubes exposed after 30 seconds of etching
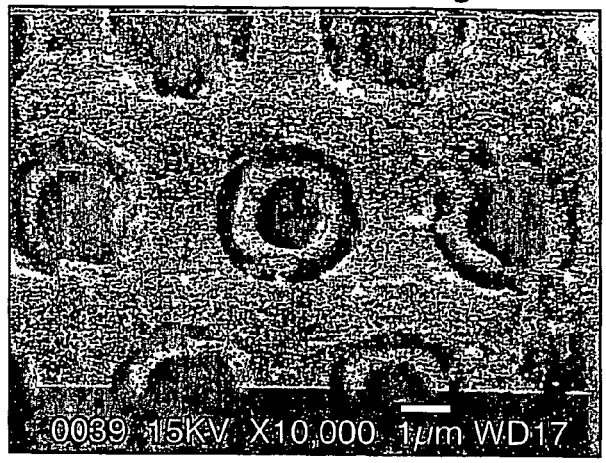
Fig. 5. SBT tubes after 30 seconds of etching
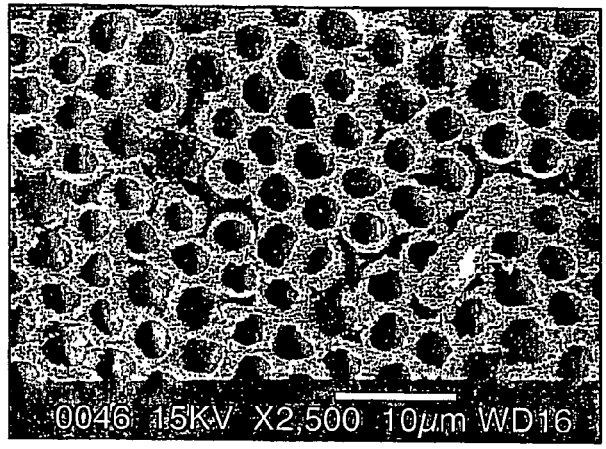
Fig. 6. Array of SBT nanotubes
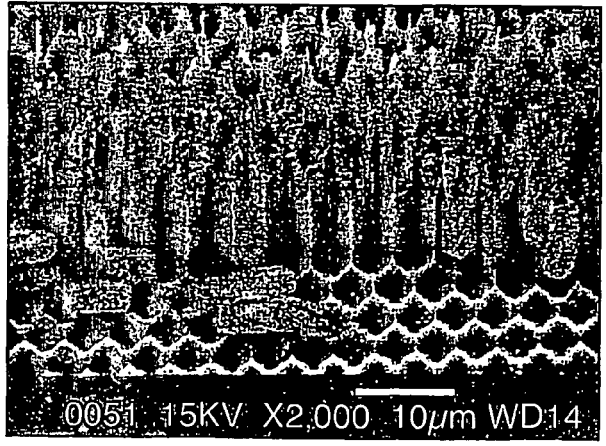

0030  12KV  X5,000  1μm WD16

0039 15KV X10,000 1μm WD17

0051 15KV X2,000 10μm WD14

0095  15KV  X10,000  1μm WD11

0097  20KV  X30,000  1μm WD11

PROCESSES OF FORMING SMALL DIAMETER RODS AND TUBES

The invention relates to methods for the production of improved arrays of tubes and rods formed of material having voltage-dependent index of refraction, which can be used as photonic devices. It also relates to processes for the production of independent piezoelectric small diameter rods and tubes (nanorods and nanotubes) which can be used in a variety of applications.

It is known that certain porous materials, in which the pores are filled with material of high refractive index n, n being variable with voltage, are useful as photonic crystals. The porous substrates most commonly used are silicon Si and alumina $Al_2O_3$. It is also generally considered desirable to provide such crystals in very small sizes. This can lead to reduced robustness of the crystal itself.

DE-A-10101119 describes a photonic crystal which is said to be mechanically stable and easy to handle.

U.S. Pat. No. 6,093,246 describes the production of photonic crystals having a substrate and a plurality of upwardly extending spaced elements in the form of pillars or rods. These pillars or rods are produced by a charged-particle beam deposition method. It is disclosed that after the spaced pillars have been formed by this method the region between the spaced pillars may be filled in with a spacer material which is preferably transparent or invisible to an incident electromagnetic wave.

It would be desirable to provide convenient methods by which photonic crystals can be produced which are voltage-tunable and can be made robust and easy to handle.

According to the invention we provide a method for the production of a photonic device comprising providing a substrate, forming in the substrate substantially straight pores, lining or filling the pores with a lining material, preferably a material having voltage-dependent index of refraction, and removing part but not all of the substrate material so that an array remains of tubes or rods of material which preferably has voltage-dependent index of refraction.

The array of rods or tubes itself can be used as a photonic device but a particular advantage of the method of the invention lies in the fact that it is possible, having removed substantially all of the substrate material, to fill the resulting air space between the tubes or rods with a material which has appropriate properties (transparent to light, chemically inert and physically robust) and thus produce a photonic device with robustness improved over the device before removal of the substrate.

The substrate can be any material in which it is possible to produce substantially straight pores and which can be removed without removal of the material deposited in the pores. Examples are silicon, alumina, germanium and thermoplastic materials. Silicon is preferred due to the variety of known techniques for producing straight pores in silicon and the ease with which it may be removed without damaging the deposited tubes or rods.

Known methods for producing the porous substrate can be used. Ottow et al describe production of a two dimensional array of pores in a silicon substrate in Appl. Phys. A63, 153-159 (1996) and Schilling et al describe a three-dimensional array in Appl. Phys. Lett. Vol. 78, No. 9, 26 Feb. 2001, 1180-1182. The substrate may have a rectangular/orthogonal or hexagonal array of pores. Generally the pores are substantially cylindrical, substantially parallel and extend through the thickness of the substrate.

The aspect ratio (ratio of depth to diameter) of the pores is generally high, for instance at least 5, preferably at least 10 or even at least 50. The pores preferably have diameter from around 0.05 to 5 µm, generally above about 0.1 µm and in particular from about 0.3 to 4 µm.

The distance between the pores is preferably in the range 0.1 to 10 µm, generally 0.5 to 5 µm, typically about 1 µm.

Once the pores have been filled or lined (by methods discussed below) the substrate is partially but not completely removed. Removal can be by any appropriate method which does not destroy or damage the tubes or rods formed by deposition of the material in the pores. One suitable method is etching, for instance by acid or alkali. HF is a particularly preferred etchant, in particular when the substrate is silicon. Thus an etchant solution of 15/50/35% HF/HNO3/H2O could be used. If the melting point of the substrate is appropriate for this, then the substrate material can be removed by melting or even evaporation.

The removal step removes substantially all but not entirely all of the substrate material, so that sufficient substrate material remains to hold the tubes or rods in an array. Generally the base of the substrate, preferably perpendicular to the length of the pores, is retained, so that the structure remaining is a series of upwardly-extending rods or tubes.

When tubes are produced it is possible to fill electrolytic or non-electrolytic gold into the ends to a depth of a few microns. This provides electrodes along the length of the tube. It is also possible to pre-coat the inside of the pores, with gold before deposition of the lining material. The inside of the tube can also be filled with gold, producing concentric cylindrical electrodes.

The resulting array can itself be used as a photonic device and indeed can have improved properties over a device in which the substrate has not been removed. For instance, a filled porous silicon substrate can act as a photonic device but when the silicon has been removed improved properties can be obtained due to easier passage of laser light through the air between the remaining rods or tubes in comparison with passage of laser light through silicon.

However, the resulting structure can be potentially rather fragile and it is therefore preferred that before use it is provided with a casing or other protection.

In a particularly preferred aspect of the invention, the spaces formerly filled by substrate materials are filled with a second filler material. A material which is transparent to light, chemically inert and physically robust can be used. Examples are glasses and perspex. The second filler material preferably has refractive index in the range 1.2 to 3, more preferably 1.2 to 2.

This aspect of the invention results in a photonic device which can have improved properties over a device from which the substrate has not been removed and additionally is robust and easy to handle.

The dimensions of the porous substrate usually determine the final dimensions of the device produced and vary according to the intended final application. However, width and length are, independently, generally from 0.1 to 10 cm, preferably 0.5 to 5 cm. Thickness can be from 1 to 200 µm, preferably 10 to 100 µm.

Any appropriate method of filling the pores or lining the pores can be used. Methods such as chemical solution deposition and chemical vapour deposition can be used, in particular in cases when the pores are of large enough diameter that these methods are effective. These methods tend to be ineffective for pores of smaller size, for instance below 5 µm.

A preferred method comprises providing a precursor solution containing precursors for the material to be deposited, forming fine droplets of the precursor solution and contacting the fine droplets with the porous substrate.

This fine mist deposition method gives a high fill fraction (percentage of pores substantially completely filled), which can be substantially 100%. It also gives uniform thin coatings in cases where only lining is required.

In this aspect of the invention a solution of precursors for the material to be deposited, in stoichiometric proportions, is provided as a fine mist of droplets. The technique used is known and has been described by McMillan et al in Integrated Ferroelectrics 1992, vol. 2, pp 351-359.

Usually a mixture of two or more different precursors is used. A solution of the appropriate precursor(s) is treated so as to generate a fine mist of droplets. The solvent is preferably non-aqueous. Suitable solvents include octane and toluene. Other solvents may be chosen provided they have volatility appropriate to allow them to carry the precursor onto the substrate under the chosen conditions and subsequently evaporate from the porous substrate under convenient conditions. The precursor liquid is generally at a temperature of from 0 to 50° C., preferably 25 to 30° C.

The size of the droplets is generally chosen according to the size of the substrate pores. Preferably the droplets have diameter not more than 4 µm, preferably not more than 2 µm, and in particular not more than 1 µm. It is particularly preferred for the droplets to have size not more than 0.5 µm. In this aspect of the invention droplets are preferably in the size range 0.1 to 0.3 µm.

The most preferred technique for generating droplets of appropriate size is ultrasound. For instance, a piezoelectric transducer-resonating at approximately 1.5 MHz can be used.

The droplets generated are carried into the deposition chamber by an inert carrier gas-such as nitrogen or argon. Alternatively, a non-inert gas can be advantageous in some circumstances, such as a mixture of 50% argon/50% oxygen. Suitable carrier gas flow rates are from 50 to 200 cm$^3$/min.

Deposition generally takes place at a rate of from about 15 to 300 Å/min.

Preferably the substrate is illuminated with ultraviolet radiation during the deposition process. Generally radiation in the near UV range (300 to 400 nm) is effective.

To aid penetration of mist droplets-into the pores, the substrate can be held stationary. However, rotating the substrate is also possible.

Deposition is carried out under vacuum but an advantage of this preferred process of the invention is that high vacuum is not required. For instance pressure of 0.2 atmospheres and above, preferably 0.4 atmospheres and above and even around 0.5 atmospheres, can be used. This compares favourably with many known deposition techniques which require vacuum of the order of 0.01 atmospheres. Generally pressure is not more than 0.9 atmospheres, preferably not more than 0.8 atmospheres. Preferably it is in the range 0.65 to 0.90 atmospheres.

This process may be carried out at ambient temperature. Although a wide variety of temperature ranges may be used, for instance from 0 to 100° C., temperatures in the range 15 to 40° C. and especially 20 to 30° C. are preferred.

Suitable pore configurations are known. The pores may be in a two dimensional array such as described by Ottow et al or a three dimensional array such as described by Schilling et al. In a three-dimensional array, "pore diameter" discussed above is the minimum diameter. Both rectangular/orthogonal and hexagonal arrays are available. Generally the pores are substantially cylindrical, substantially parallel and extend through the thickness of the substrate. The aspect ratio (ratio of depth to diameter) is generally high, for instance at least 5, preferably at least 10 or even at least 50.

Once the droplets of precursor solution have been deposited within the pores it is usually necessary to heat the substrate in order to evaporate the carrier solvent. This is particularly appropriate for metal alkoxide precursors. Appropriate temperatures may be chosen according to the solvent and the precursors but are preferably in the range 200 to 400° C., preferably 250 to 350° C.

Alternatively, the deposited film may be allowed to hydrolyse at ambient temperature (eg about 15 to 30° C., generally 20 to 25° C.). This is particularly appropriate for metal carboxylate precursors.

Although the method of this aspect of the invention can be carried out as a single stage process in which all deposition is carried out prior to any evaporation, we find that, when filling of the pores is required, the most effective filling efficiency can be achieved by means of a multi-stage process, in which, after some deposition has taken place, deposition of droplets is suspended and the substrate is heated to within the temperature ranges discussed above to induce evaporation of the solvent. Further deposition is then carried out, followed by a further evaporation stage. Thus the process of the invention may involve two, three or even more (for instance up to six) separate deposition and evaporation stages. As many stages are used as are necessary to achieve the desired fill fraction.

We believe that the filling mechanism involves adhesion to the pore walls rather than filling from the bottom up, which has the advantage of further filling and more even release of organic material from the coating.

Once the appropriate level of deposition has been achieved, it is generally appropriate to subject the filled substrate to annealing so as to convert the deposited material to the appropriate crystalline form. The time and temperature required depend upon the material desired and the precursors used. When the substrate is silicon, lower annealing temperatures are preferred as this minimises oxidation of the substrate surface. Suitable annealing times are from 5 mins to 2 hours, preferably 15 mins to 1 hour, eg around 30 mins. Suitable annealing temperatures are generally in the range 600 to 850° C.; preferably at least 650° C. and/or not more than 800° C.

The material used to fill or line the pores is any appropriate material for use in a photonic device. It may be a material having high index of refraction, for instance above 1.2, more preferably above 1.4, most preferably above 2 and even as high as 3 or above. Preferably it is a material which has index of refraction n which varies with applied voltage. Tuning of the final device is then achievable by varying an applied DC voltage across the thickness of the device.

Many of the lining materials useful in the invention are ferroelectric, such as $BaTiO_3$, lead zirconate titanate (PZT), strontium bismuth tantalate (SBT), antimony sulfide iodide (SbSI), and barium strontium titanate (BST).

It has also not previously been possible to fabricate SBT planar films with the a-axis normal to the plane. The array produced by the process of the invention may allow production of ferroelectric devices with the ferroelectric (polar) a-axis normal to the substrate plane.

Non-ferroelectric materials which have voltage-variable refractive index can also be used and include rutile, $TiO_2$, and strontium titanate, $SrTiO_3$.

Precursors may be selected from organometallic complexes such as metal carboxylates and metal alkoxides. Suitable precursors include $Bi(thd)_3$, $SrTa_2(OEt)_{10}(dma_2$ and $Ta(OEt)_4(dmae)$ and $Bi(mmp)_3$. In these formulae thd is tetramethylheptadiamate, dmae is dimethylaminoethanolate, and mmp is methoxymethylpropanolate.

We also find that a variant of the process of the invention, in which the deposited material is piezoelectric, produces a novel device which is an array of substantially parallel piezoelectric rods or tubes of external diameter not more than 10 µm. Such a device has the benefit that the rods or tubes are addressable via the remaining substrate and, in the case of tubes, can be used for drug delivery or inkjet printing, by choice of a material whereby the tube diameter can be caused to reduce. By applying a voltage or series of voltages to the tubes droplets of liquid about 1 micron in diameter can be ejected, in the case of drug delivery via a pacemaker-like system. A further application is microscopic walker devices, whereby the material forming the rods or tubes can be caused to distort mechanically under applied voltage. Devices of this type are described in Vettiger et al, IBM Journal of Research and Development 44, 323-40 (2000). Such devices can be used in fabrication of other microelectronic devices such as electrostatic motors. Such a device could serve to carry an array of atomic force microscopy tips.

In a further variant, in which the substrate material is completely removed, the method allows formation of independent piezoelectric rods or tubes of very small diameter (nanorods or nanotubes). They can also be ferroelectric.

Thus in a third aspect of the invention we provide a method for producing piezoelectric rods or tubes having external diameter not more than 10 µm, the process comprising providing a substrate, forming in the substrate substantially straight pores, lining or filling the pores with a piezoelectric material and removing the substrate material completely so that tubes or rods having diameter not more than 10 µm remain.

If the pores are filled then the subsequent removal of the substrate material leads to a number of independent piezoelectric rods. These rods may be used in a variety of applications, including use as electroactive fibres in composites.

Alternatively, where the pores are lined but not filled the result of removal of the substrate material is a number of tubes having external diameter not more than 10 µm. Using the method of the invention it is possible to achieve tubes having wall thickness of from 10 to 60 nm, for instance 20 to 50 nm, typically about 40 nm. Internal diameter is often below 8 µm, preferably below 5 µm and can be below 2 or even below 1 µm and the invention can produce tubes having internal diameter about 0.5 µm.

The materials discussed above for application in the first aspect of the invention can be used as piezoelectric materials in this aspect of the invention. The materials can also be pyroelectric. Pyroelectric materials are particularly useful when the final array is to be used for photon detection or imaging (especially infra-red) applications.

The resulting piezoelectric tubes of small diameter can be used in a variety of applications. For instance they are useful in ink jet printing applications. In ink jet printing processes a number of inert tubes of small diameter are provided through which ink is forced by means of a vibrating diaphragm. Tubes of the small diameters achievable with the invention will allow very high resolution printing. The tubes can also be used in piezoelectric scanners in scanning probe microscopes.

Since the tubes are formed from piezoelectric material, it is also possible to configure them so that, rather than being inert as in standard ink jet printing systems, they have diameter which varies with voltage and thus contributes to the expulsion of ink droplets.

Similarly, tubes of small diameter are potentially useful in drug delivery applications for delivery of very small doses of drug, either passively or, by means of voltage-variable diameter, actively.

The fibres can be used in pyroelectric detectors and memory capacitors that cannot be filled by other nanotubes. Other uses include as micropositioners or movement sensors.

The invention will now be illustrated with reference to the Figures.

FIG. 1 illustrates a perspective view of a substrate 1 having formed therein an array of pores 2 which have been lined with lining material 3.

FIG. 2 shows the array produced after all but the base of the substrate 1 has been removed, leaving air space 4 between the resulting tubes 5.

FIG. 3 demonstrates a photonic device produced by infilling the space 4 with a filler material 6 such as glass or perspex.

FIG. 4 is a SEM micrograph illustrating the top of a substrate after the substrate was etched for 30 seconds.

FIGS. 5 and 6 are SEM micro graphs illustrating the substrate after further etching for 30 seconds showing the Si walls between tubes removed leaving an array of SBT tubes separated by air.

EXAMPLE 1

A porous Si substrate with a hexagonal array of pores with diameter 3.5 µm and 100 µm deep was filled using misted deposition of Sr/Bi/Ta ethyl hexanoate precursors (in toluene) in the stoichiometry $Sr_{0.8}Bi_{2.2}Ta_{2.0}O_9$. The deposition was carried out at ambient temperature at 700 torr under UW irradiation. After deposition, the partially filled substrate was pyrolysed at 300° C. in air for 10 mins followed by crystallisation by heating to 800° C. in air for one hour.

The substrate was then etched for 30 seconds in 15/50/35 vol % of $HF/HNO_3/H_2O$. Examination under SEM revealed partial exposure of SBT tubes ca. 3 µm in diameter, with a uniform wall thickness of ca. 100 nm, FIG. 4. After further etching for 30 secs, the Si walls between tubes had been removed leaving an array of SBT tubes separated by air, FIG. 5 and FIG. 6.

EXAMPLE 2

The method of Example 1 was repeated except that the pores had diameter 800 mm and 2 µm, and after deposition the filled porous substrates were pyrolysed for 30 min at 100° C. and then 30 min at 300° C. After deposition and pyrolysis, the filled photonic substrates were thermally annealed at 850° C. for 30 min in air. The degree of crystallinity was determined by means of XRD (BEDE D1D1 diffractometer). Etching of the Si substrate was carried out in an aqueous $HF/HNO_3$ solution (15/50 vol %). Ferroelectric hysteresis loops were obtained at room temperature using a Radiant Technologies "Precision Premier" tester. Au electrodes were sputtered through a shadow mask.

Figure 2:
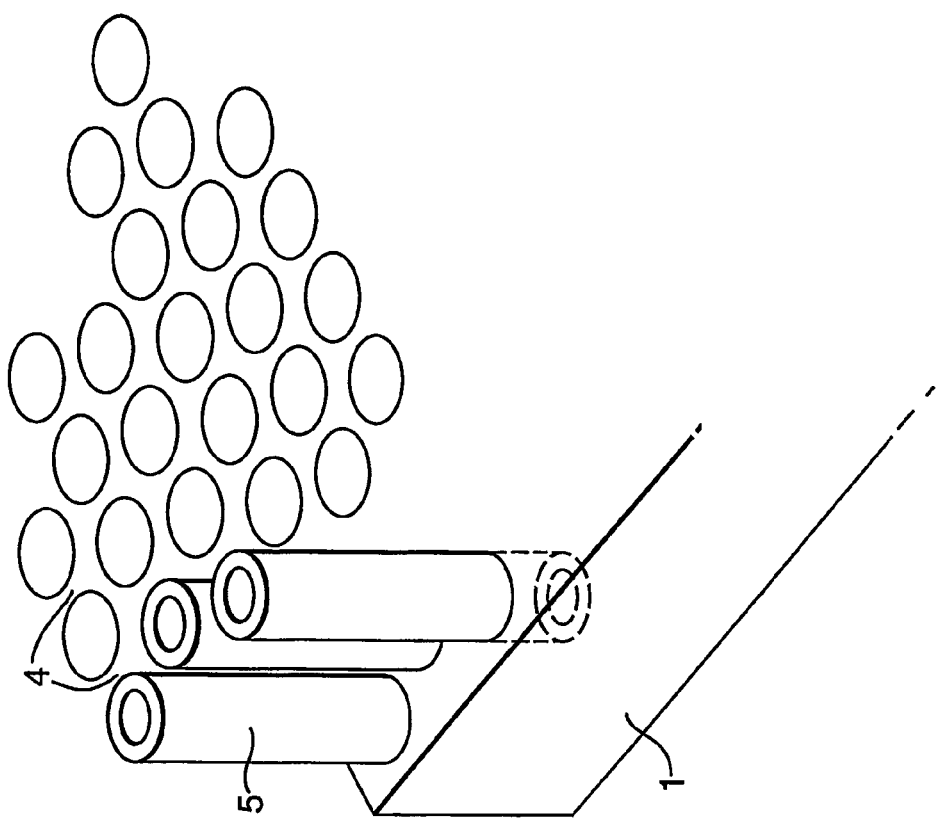
Figure 1:
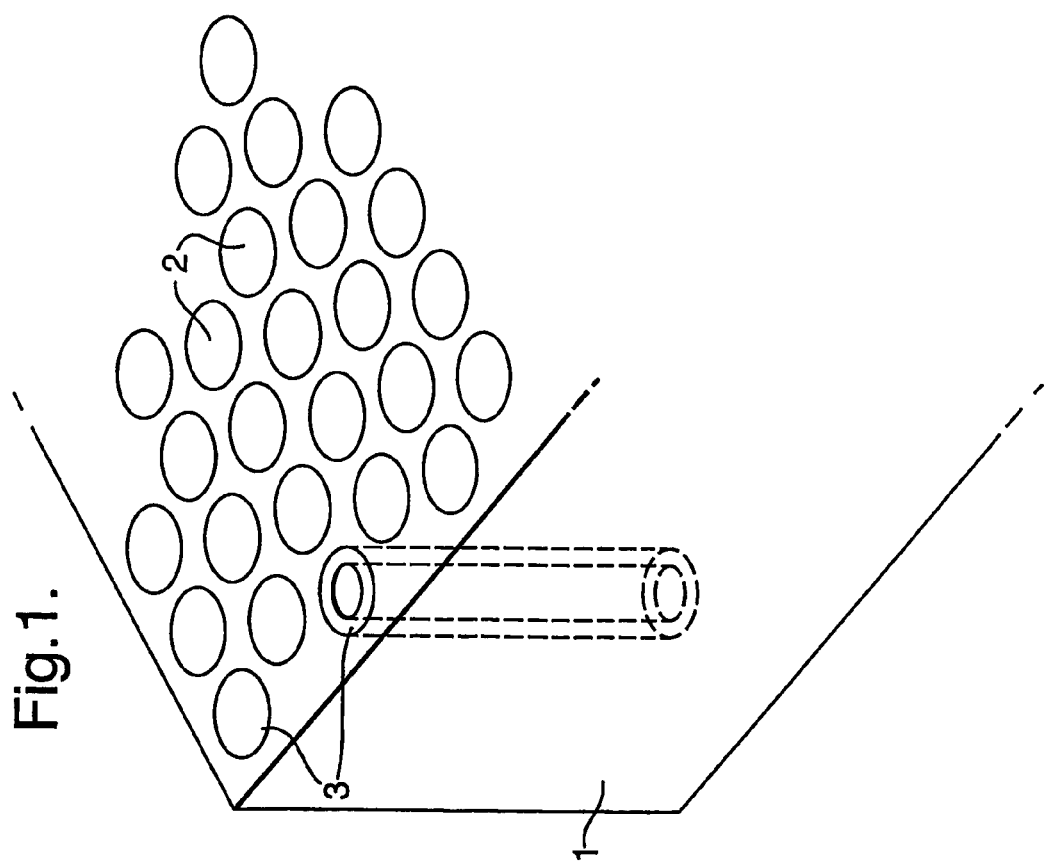
Figure 3:
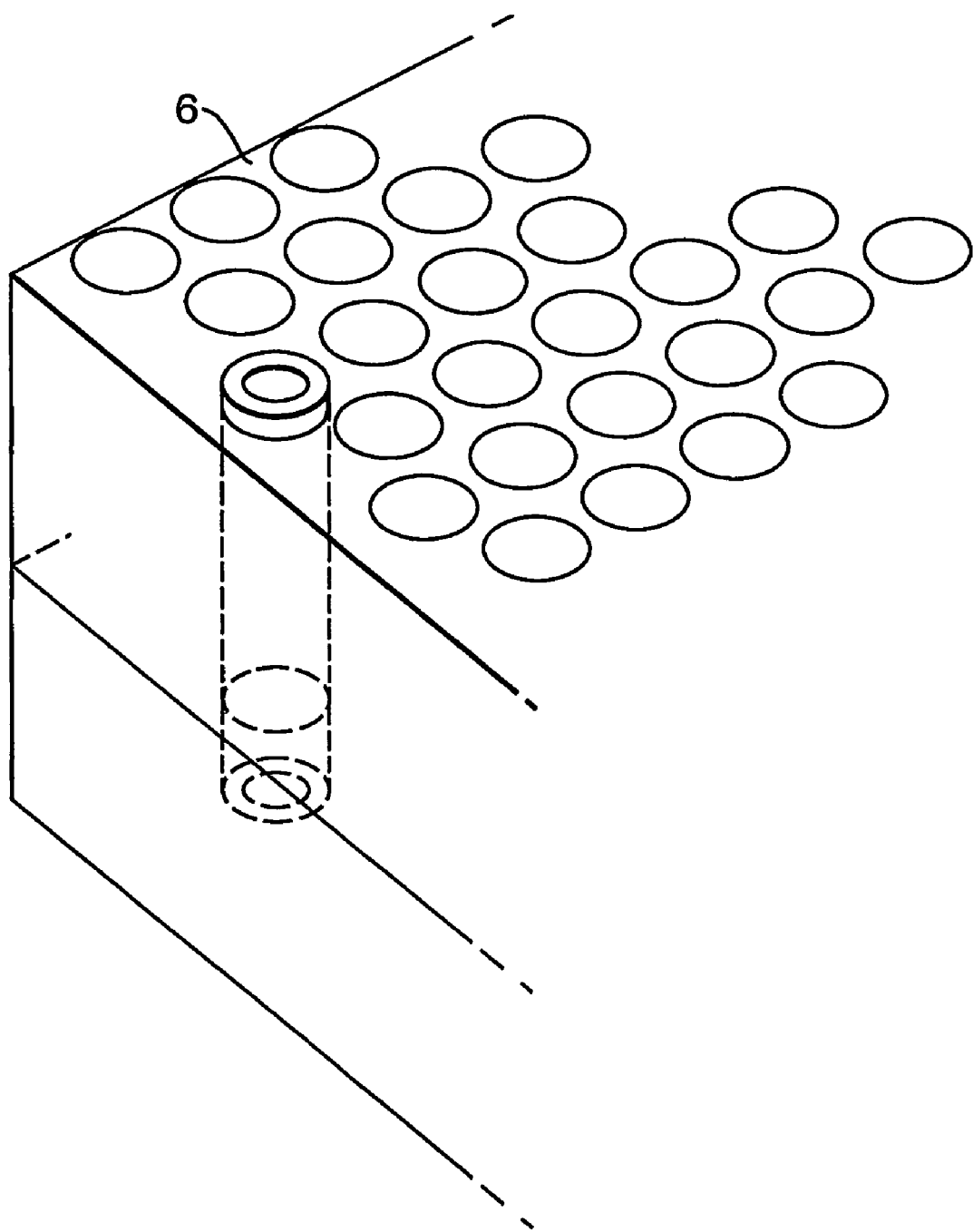
Figure 7:
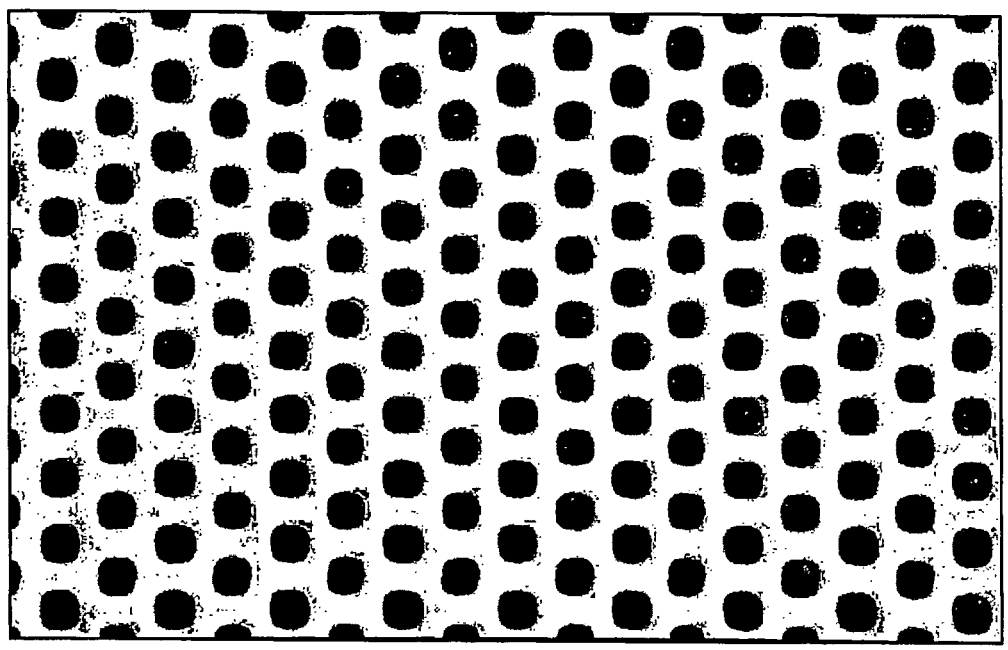
FIG. 7 is a SEM micrograph of an unfilled photonic crystal with a pore diameter of about 800 nm.
Figure 8:
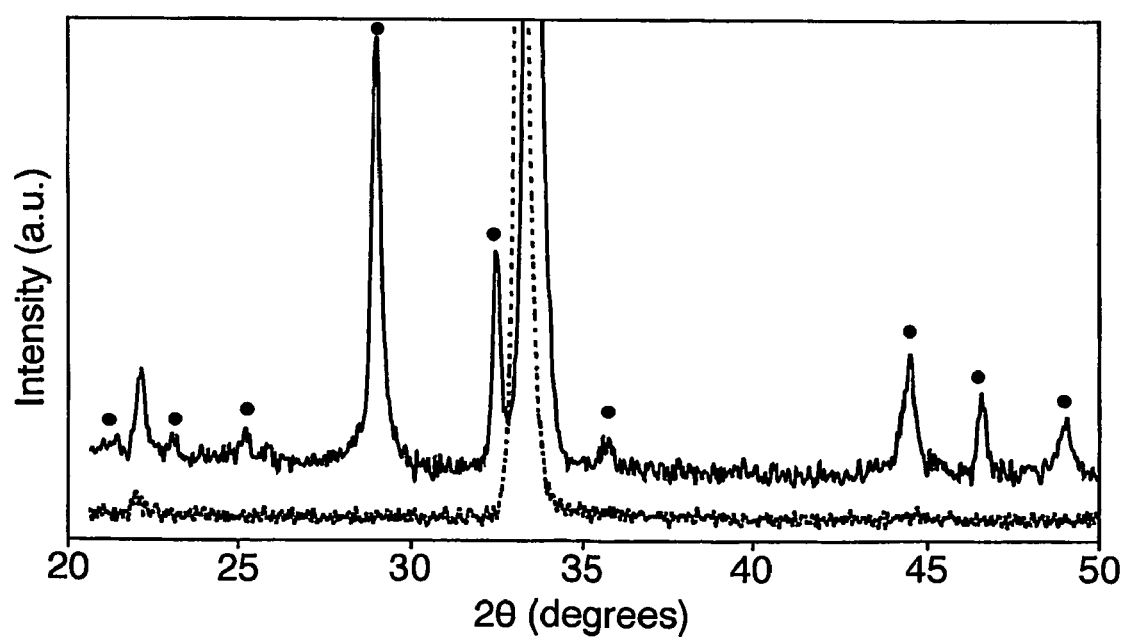
FIG. 8 shows XRD data for a filled photonic crystal with a pore diameter of 800 nm.

An SEM micrograph of an unfilled photonic crystal with pore diameter about 800 nm is shown in FIG. 7. After repeated depositions and thermal annealing, XRD analysis of the porous photonic substrates revealed the presence of crystalline SBT. XRD data for the filled photonic crystal with pore diameter 800 nm are shown in FIG. 8. The most intense reflection at about 33° C.-34° C. 2θ and the weak reflection at 22° C. 2θ are due to the substrate, as indicated by the data obtained from the "blank" photonic crystal before filling. The other reflections are consistent with crystalline SBT of stoichiometry $Sr_{0.8}Bi_{22}Ta_2O_{9+y}$. The relative intensities do not indicate any epitaxy, suggesting the deposited SBT phase is a randomly orientated polycrystalline ceramic.

Figure 9:
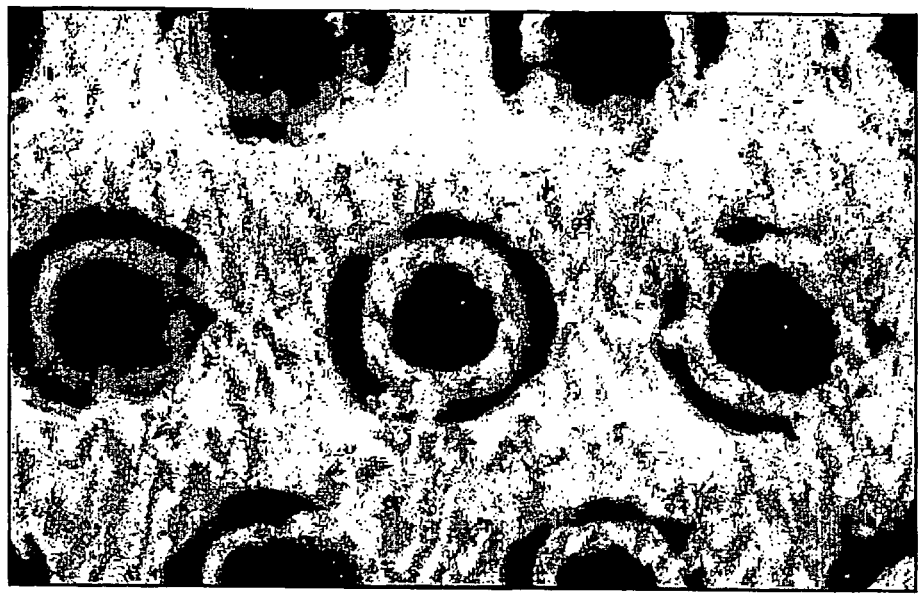
FIG. 9 is a SEM micrograph illustrating a photonic crystal with a pore diameter of 2 µm after etching for 30 seconds with aqueous $HF/HNO_3$.
Figure 10:
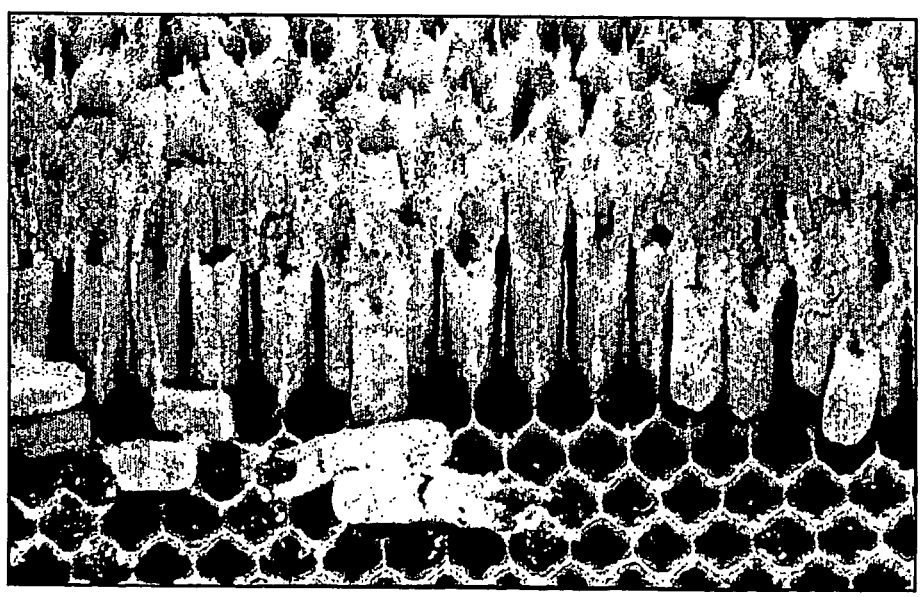
FIG. 10 is a SEM micrograph illustrating a cross-sectional view after complete removal of the host Si walls between pores.

After etching of the photonic crystal with pore diameter 2 μm for 30 s with aqueous $HF/HNO_3$ the interface between the Si substrate and SBT coating is dissolved, exposing the uniform SBT tube; see FIG. 9. The tube walls are very uniform with a thickness of about 200 nm. The same sample is shown in cross-sectional view after complete removal of the host Si walls between pores; FIG. 10. The result is a regular array of tubes attached to the host Si matrix only at the tube base. Although these tubes have suffered damage during handling, it is clear that the pores have been filled uniformly to the bottom, at a depth of about 10.0 μm.

Figure 11:
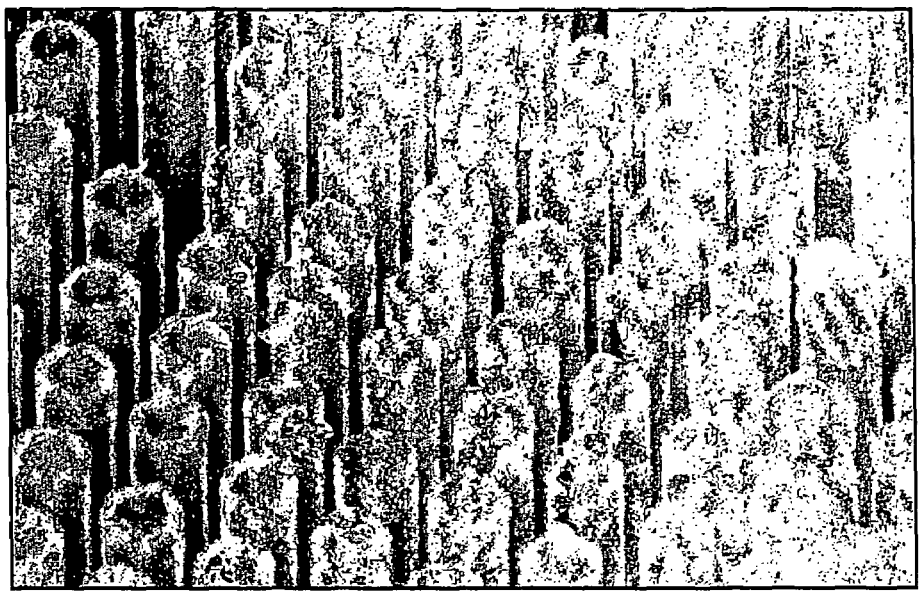
FIG. 11 is a SEM micrograph illustrating a second photonic crystal with a pore diameter of 800 nm that underwent fewer depositions and after etching revealed a regular array of uniform tubes of diameter 800 nm.
Figure 12:
FIG. 12 is a SEM micrograph of the second photonic crystal demonstrating that the wall thickness of the tubes is uniform.

The second photonic crystal with pore diameter 800 nm underwent fewer depositions and after etching revealed a regular array of uniform tubes of diameter 800 nm; FIG. 11. The wall thickness is uniform and, 100 nm; FIG. 12. The tubes are about 100 μm long, are completely discrete, and are still attached to the host Si matrix, creating a perfectly registered hexagonal array. Free standing tubes may be produced by completely dissolving the host Si matrix.

The invention claimed is:

1. A method for the production of a photonic device comprising providing a substrate, forming in the substrate substantially straight pores, lining or filling the pores with a lining material, and removing part but not all of the substrate material so that an array remains of tubes or rods of the lining material.

2. The method according to claim 1, wherein the lining material has a voltage-dependent index of refraction.

3. The method according to claim 1, wherein the pores are substantially parallel and the portion of substrate material which remains forms a base at the ends of the tubes or rods.

4. The method according to claim 1, wherein the substrate material is removed by etching.

5. The method according to claim 1, wherein the substrate is silicon.

6. The method according to claim 1, further comprising the step of filling the space left by the removed substrate material with a filling material.

7. The method according to claim 6, wherein the filling material is glass or perspex.

8. The method according to claim 1, wherein the pores have diameters from 0.05 to 5 μm.

9. The method according to claim 1, wherein the lining material is deposited by a process comprising providing a precursor solution containing precursors for the material to be deposited, forming the precursor solution into fine droplets and contacting the fine droplets with the porous substrate to effect deposition of the precursor solution in the pores.

10. A process for the production of rods or tubes of piezoelectric material, comprising providing a substrate, forming in the substrate substantially straight pores, filling or lining the pores with a piezoelectric material, and completely removing the substrate material so that independent rods or tubes of piezoelectric material remain.

11. The process according to claim 10, wherein the piezoelectric material is deposited in the pores by a process comprising providing a precursor solution containing precursors for the material to be deposited, forming the precursor solution into fine droplets and contacting the fine droplets with the porous substrate to effect deposition of the precursor solution in the pores.

12. The process according to claim 10, wherein the rods or tubes have external diameters of not more than 10 μm.

13. A process for the production of an array of rods or tubes of piezoelectric material, comprising providing a substrate, forming in the substrate substantially straight pores, filling or lining the pores with piezoelectric material, and removing all but the base of the substrate material so that an array remains of upwardly-extending tubes or rods of piezoelectric material.

14. An array of rods or tubes of piezoelectric material having diameters of not more than 10 microns, the rods or tubes being parallel and upwardly extending from a supporting base of substrate material.

15. The method according to claim 1, wherein the pores have diameters from 0.3 to 4 μm.

16. The process according to claim 10, wherein the rods or tubes have external diameters from 0.05 to 5 μm.

17. The process according to claim 10, wherein the rods or tubes have external diameters from 0.3 to 4 μm.

18. A drug delivery apparatus, comprising the array of rods or tubes of piezoelectric material of claim 14.

19. An inkjet printing apparatus, comprising the array of rods or tubes of piezoelectric material of claim 14.

20. A detector array, comprising the array of rods or tubes of piezoelectric material of claim 14.

21. A mechanical walker device, comprising the array of rods or tubes of piezoelectric material of claim 14.

* * * * *

UNITED STATES PATENT AND TRADEMARK OFFICE
CERTIFICATE OF CORRECTION

PATENT NO. : 7,611,578 B2
APPLICATION NO. : 10/544816
DATED : November 3, 2009
INVENTOR(S) : Morrison et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 587 days.

Signed and Sealed this

Twelfth Day of October, 2010

David J. Kappos
*Director of the United States Patent and Trademark Office*